United States Patent
Griffith et al.

(10) Patent No.: US 9,515,604 B2
(45) Date of Patent: Dec. 6, 2016

(54) DRIVING CRYSTAL OSCILLATOR STARTUP AT ABOVE, BELOW AND OPERATING FREQUENCY

(71) Applicant: TEXAS INSTRUMENTS INCORPORATED, Dallas, TX (US)

(72) Inventors: Danielle Griffith, Richardson, TX (US); Per Torstein Roine, Oslo (NO); James Murdock, Richardson, TX (US); Ryan Smith, Sachse, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/584,726

(22) Filed: Dec. 29, 2014

(65) Prior Publication Data

US 2015/0333694 A1    Nov. 19, 2015

Related U.S. Application Data

(60) Provisional application No. 62/000,111, filed on May 19, 2014.

(51) Int. Cl.
| | |
|---|---|
| H03B 5/32 | (2006.01) |
| H03L 7/24 | (2006.01) |
| H03B 5/06 | (2006.01) |
| H03B 5/36 | (2006.01) |

(52) U.S. Cl.
CPC .............. *H03B 5/06* (2013.01); *H03B 5/362* (2013.01); *H03B 5/364* (2013.01); *H03B 5/368* (2013.01)

(58) Field of Classification Search
CPC ... H03B 5/1215; H03B 5/1228; H03B 5/1253; H03B 2201/025; H03B 5/06; H03B 5/1212; H03B 5/1265; H03B 2200/0038; H03B 2200/005; H03B 2200/0098; H03B 5/04; H03B 5/124; H03B 5/1243; H03B 5/1221; H03B 19/00; H03B 2200/0074; H03B 27/00; H03B 5/1203; H03B 5/1218; H03B 5/1256; H03B 5/362; H03B 5/364; H03B 5/368; H01L 7/0812; H01L 7/099; H01L 1/00; H01L 1/02; H01L 1/022; H01L 3/00; H01L 7/08; H01L 1/026; H01L 7/00; H01L 7/06; H01L 7/22; H01L 1/025; H01L 2207/504
USPC ....... 331/2, 46, 55, 158, 116 R, 116 FE, 155
See application file for complete search history.

(56) References Cited

U.S. PATENT DOCUMENTS

| | | | |
|---|---|---|---|
| 6,480,071 B1 | 11/2002 | Fujii et al. | |
| 6,819,195 B1 * | 11/2004 | Blanchard | H03B 5/06 331/158 |
| 2002/0017961 A1 | 2/2002 | Kobayashi et al. | |
| 2002/0196366 A1 | 12/2002 | Cahill, III | |
| 2006/0017518 A1 | 1/2006 | Wilcox | |

(Continued)

FOREIGN PATENT DOCUMENTS

WO    WO 2007037884 A2 *   4/2007   ............... H03B 5/06

*Primary Examiner* — Arnold Kinkead
(74) *Attorney, Agent, or Firm* — Lawrence J. Bassuk; Frank D. Cimino

(57) ABSTRACT

A circuit includes a crystal oscillator to generate an output frequency for a circuit. A driving oscillator generates a startup signal having a driving frequency that is provided to activate the crystal oscillator. The driving frequency of the startup signal is varied over a range of frequencies that encompass the operating frequency of the crystal oscillator to facilitate startup of the crystal oscillator.

18 Claims, 6 Drawing Sheets

(56) References Cited

U.S. PATENT DOCUMENTS

2007/0069829 A1 3/2007 Gehring
2011/0032011 A1 2/2011 Kim et al.
2013/0033329 A1 2/2013 Zhu et al.

* cited by examiner

DRIVING CRYSTAL OSCILLATOR STARTUP AT ABOVE, BELOW AND OPERATING FREQUENCY

CROSS-REFERENCE TO RELATED APPLICATION

This application claims the benefit of U.S. Provisional Patent Application 62/000,111 filed on May 19, 2014, and entitled ROBUST CRYSTAL OSCILLATOR STARTUP TIME REDUCTION, the entirety of which is incorporated by reference herein.

TECHNICAL FIELD

This disclosure relates to integrated circuits, and more particularly to a circuit and method to reduce startup time for a crystal oscillator.

BACKGROUND

The advent of micro-power wireless systems has gained increasing importance for a variety of applications. One example of a micro-power system includes sensor applications. For instance, with recent advances in micro-technology and its associated interfaces, signal processing, and RF circuitry, system focus has shifted away from limited macro-sensors communicating with base stations to creating wireless networks of communicating micro-sensors that aggregate complex data to provide rich, multi-dimensional data exchanges. While individual micro-sensor nodes of a given network may not be as accurate as their macro-sensor counterparts, the networking of a large number of nodes enables high quality sensing networks with the additional advantages of deployment and fault-tolerance.

Each node of a micro-power wireless system utilizes a radio (e.g., transmitter and/or receiver) to communicate with the available network. Each radio of the system typically utilizes a reference clock generated from a high quality factor (Q) oscillator. One limitation of high Q-factor oscillators is that they can take significant time to startup upon receiving power which is often on the order of hundreds of microseconds. Low power wireless networks save power by operating in a duty cycled mode where a given device spends most of its time in sleep mode. A given radio typically turns on to send data for only a few hundred microseconds to conserve power. Thus, startup time due to a high-Q oscillator can be longer than the respective data packet itself. Long crystal oscillator startup time therefore can greatly increase power consumption in micro-power networks.

SUMMARY

This disclosure relates to a circuit to reduce startup time for a crystal oscillator.

In one example, a circuit includes a crystal oscillator to generate an output frequency. A driving oscillator generates a startup signal having a driving frequency that is provided to activate the crystal oscillator. The driving frequency of the startup signal is varied over a range of frequencies that encompass the operating frequency of the crystal oscillator to facilitate startup of the crystal oscillator.

In another example, a system includes a crystal oscillator having an input and an output. A driving oscillator provides a startup signal to the input of the crystal oscillator. The driving oscillator includes a control input. A duty cycle adjuster coupled to the control input of the driving oscillator varies the startup signal over a range of frequencies that encompass the operating frequency of the crystal oscillator.

In yet another example, a method includes generating a duty cycle command to select a range of frequencies to operate a driving oscillator. The method includes adjusting the range of frequencies of the driving oscillator based on the duty cycle command. The range of frequencies includes the operating frequency of a crystal oscillator. The method includes applying an output of the driving oscillator as a startup signal to add energy to the crystal to facilitate startup of the crystal oscillator.

DETAILED DESCRIPTION

This disclosure relates to a circuit to reduce startup time for a crystal oscillator. Startup time can be reduced for the crystal oscillator by exciting the crystal over a range of frequencies that are near the operating frequency (i.e., resonant frequency) of the crystal. For example, if the operating frequency of the crystal oscillator were 48 MHz, driving frequencies can be varied above and below the operating frequency of 48 MHz to enhance the ability of the crystal to rapidly begin to oscillate at its operating frequency. In one example, a driving oscillator can be provided to generate a startup signal having a driving frequency that is provided to activate the crystal oscillator. The driving frequency of the startup signal can be varied over a range of frequencies that encompass the operating frequency of the crystal oscillator to facilitate startup of the crystal oscillator. The driving oscillator can receive frequency adjustment commands from a duty cycle adjuster that manipulates frequency controls within the driving oscillator. In some examples, a controller can provide duty cycle commands to the duty cycle adjuster and contribute to initial and/or ongoing calibration of the driving oscillator in a manner that is resistant to time and temperature variations. By varying the driving frequency over such range of frequencies in this manner, as opposed to a fixed frequency, a less accurate driving oscillator may be utilized to excite the crystal near its respective operating frequency and still decrease crystal startup time.

Figure 1:
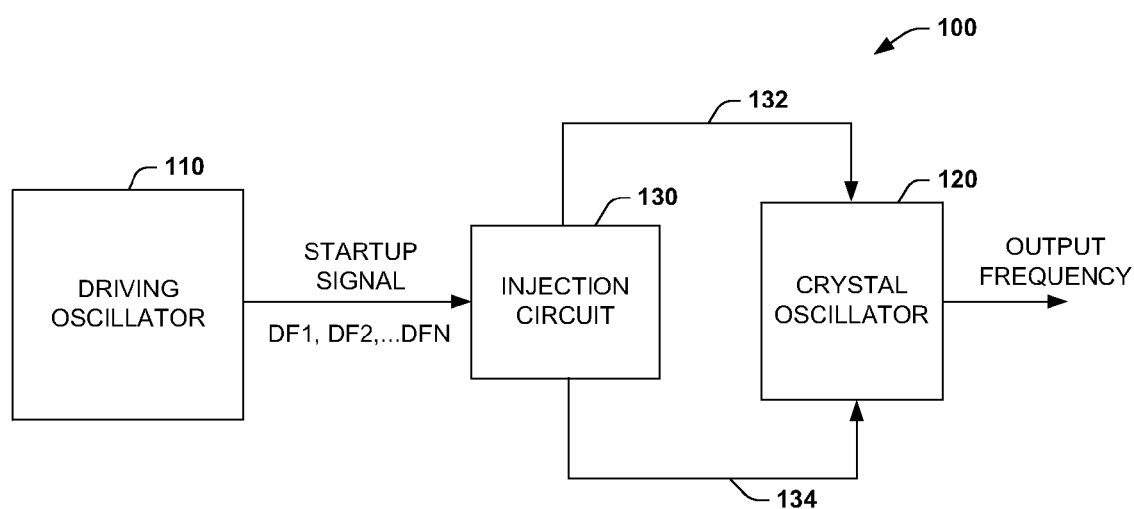
FIG. 1 illustrates an example of a circuit that employs a driving oscillator to reduce startup time of a crystal oscillator.

FIG. 1 illustrates an example of a circuit 100 that employs a driving oscillator 110 to reduce startup time of a crystal oscillator 120. As used herein, the term circuit can include a collection of active and/or passive elements that perform a circuit function such as a processing circuit or logic circuit, for example. The term circuit can also include an integrated circuit where all the circuit elements are fabricated on a common substrate, for example. As used herein, the term startup time refers to the time that power is applied to the crystal oscillator 120 until an output frequency is generated by the crystal oscillator that corresponds to the operating frequency of the oscillator. The driving oscillator 110 generates a startup signal (also referred to as startup input) that is provided to an input of an injection circuit 130 via a connection 112. The injection circuit 130 can be single buffer or a complimentary buffer pair (See e.g., FIG. 3) for example, to inject the startup signal (e.g., as a pair of out of phase signals) via its outputs 132 and 134 into corresponding terminals of the crystal oscillator 120 to reduce the startup time of the crystal oscillator. The startup signal can be varied over a range of driving frequencies (DF) shown as driving frequency 1 (DF1), DF2, though DFN, with N being a positive integer (or fraction thereof). The driving frequencies can be a range of discrete frequencies ranging from a minimum frequency to a maximum frequency, where the operating frequency of the crystal oscillator 120 is between the minimum and maximum driving frequencies.

Startup time can be reduced for the crystal oscillator 120 by exciting the crystal oscillator 120 over a range of frequencies DF1 through DFN that are near the operating frequency of the crystal. By way of example, the crystal oscillator output frequency can be employed to drive various circuits (not shown) such as wireless network radio circuits, for example that operate under low power conditions. Low power consumption can be obtained in wireless networks by operating the system intermittently, for example, where the system spends most of its time in sleep mode, waking occasionally to transmit or receive data. For some systems, such as Bluetooth Low Energy, the data transmission time can be less than the time it takes the crystal oscillator 120 to startup, which is used as the reference clock for the radio's Phase Locked Loop (PLL), for example. Therefore, the circuit 100 can reduce the oscillator startup time and thereby reduce the average power consumption of the entire system due to less active time.

As a further example, if the operating frequency of the crystal oscillator were 100 MHz, driving frequencies DF1 through DFN can be varied above and below the operating frequency of 100 MHz (e.g., provide a range of frequencies that sweep though the operating frequency) to enhance the ability of the crystal to rapidly begin to oscillate at its respective operating frequency. In one example, the driving oscillator 110 can be internally configured to generate the startup signal having a driving frequency that is provided to activate (e.g., precharge) the crystal oscillator 120. For example, the driving oscillator 110 can be configured to tune internal switch assignments that increase or decrease capacitance and/or resistance in the driving oscillator to vary the driving frequency of the startup signal over its range of driving frequencies. In another example (See e.g., FIGS. 2 and 3), the driving oscillator 110 can be provided with control codes (e.g., from a controller or the like) that tune the internal switch assignments to alter the driving frequencies of the startup signal.

As mentioned, the driving frequency of the startup signal can be varied over a range of frequencies that encompass the operating frequency of the crystal oscillator 120 to facilitate startup of the crystal oscillator. As used herein the term encompass refers to generating a range of frequencies that are at or near the operating frequency of the crystal oscillator 120 which can include generating frequencies that are at, above, and/or below the operating frequency of the crystal.

The driving oscillator 110 can receive frequency adjustment commands from a duty cycle adjuster (See FIGS. 2 and 3) that manipulates frequency controls (e.g., resistor and/or capacitor array switch assignments) within the driving oscillator. A controller (See e.g., FIG. 2) can provide duty cycle commands to the duty cycle adjuster and contribute to initial and/or ongoing calibration of the driving oscillator over time and temperature, for example. By varying the driving frequency over a range of frequencies DF1 through DFN in this manner as opposed to a fixed frequency, a highly accurate (e.g., expensive) driving oscillator 110 does not have to be implemented in order to excite the crystal oscillator 120 near its respective operating frequency to decrease crystal startup time.

As noted previously, the crystal oscillator 120 startup time can be reduced by injecting into the crystal another clock shown as the startup signal at a frequency that is near the crystal operating resonance frequency. Generally, injection techniques are effective if the injected clock is substantially not more than +/−1% different in frequency from the crystal resonance. As an example, the injected clock startup signal should be within ±1% (e.g., ±0.2%) of the crystal resonance frequency—if the injected clock were injected as a fixed frequency, for example. In contrast to the system 100, fixed frequency assignments tends to place tight tolerance requirements on the oscillator used to generate the injected clock— both stable frequency over temperature and a large number of bits used to tune the frequency.

The circuit 100 employs circuitry to dither (e.g., adjust, vary) a capacitance and/or resistance (e.g., tuning capacitor and/or resistor array) in the driving oscillator 110 to generate the injected startup signal over a range of frequencies, such that the minimum and maximum instantaneous frequencies in the range are lower and higher than the crystal resonance frequency. This approach may ensure that the crystal oscillator 120 receives some amount of energy at its resonance frequency. As a result, the circuit 100 affords a reduction in the crystal startup time such that the circuit can operate in a robust manner over process, voltage, and temperature, without requiring a high performance or large area oscillator design for the driving oscillator 110 to generate the injected clock.

Figure 2:
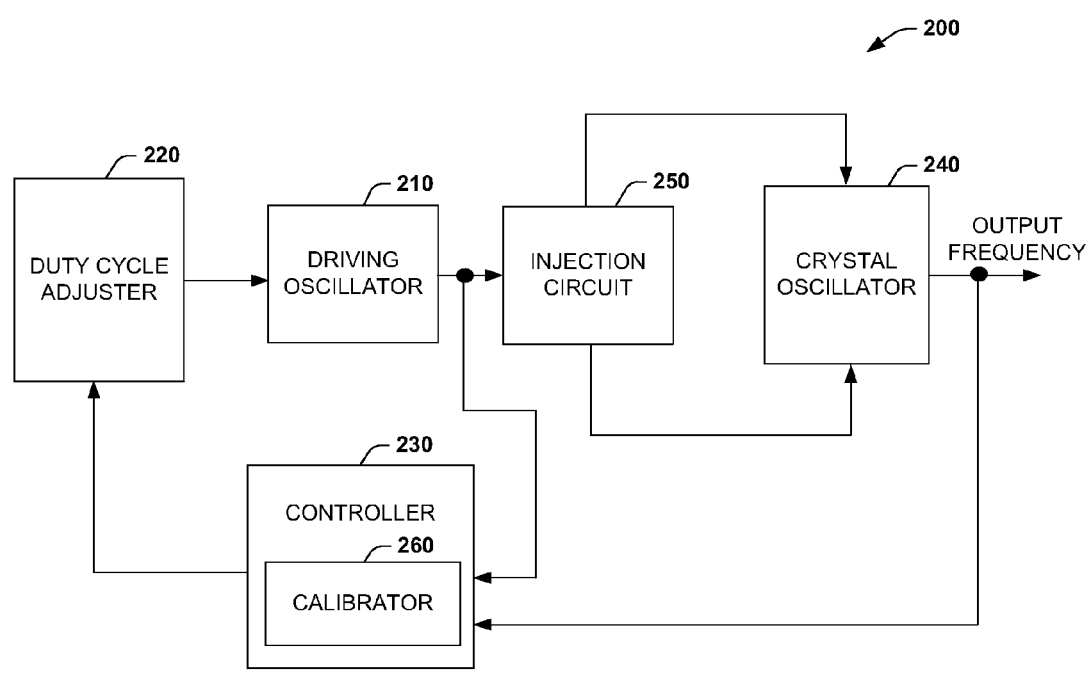
FIG. 2 illustrates an example of a circuit that employs a driving oscillator, duty cycle adjuster, and controller to reduce startup time of a crystal oscillator.

FIG. 2 illustrates an example of a circuit 200 that employs a driving oscillator 210, a duty cycle adjuster 220, and controller 230 to reduce startup time of a crystal oscillator 240. The driving oscillator 210 generates a startup signal that is provided to an injection circuit 250. Similar to the circuit described above with respect to FIG. 1, the injection circuit 250 can be a single buffer or a complimentary buffer pair for example, to inject the startup signal, as respective out of phase signals, into the crystal oscillator 240 to reduce the startup time of the crystal oscillator. As disclosed herein, the driving oscillator 210 can vary the startup signal over a range of driving frequencies that encompasses the operating (e.g., resonant) frequency of the crystal oscillator 240. In one example, the driving oscillator 210 can be configured to generate the startup signal having a driving frequency that is provided to the crystal oscillator 120. For example, the driving oscillator 210 can be configured to selectively activate (e.g., in a prescribed sequence) a switch array, which includes an arrangement of capacitors and/or resistors, to increase or decrease capacitance and/or resistance in the driving oscillator to vary the driving frequency of the startup signal over the range of driving frequencies. In another example (See e.g., FIGS. 2 and 3), the driving oscillator 210 can be provided with control codes from the duty cycle adjuster 220 that cause changes of the internal switch assignments to alter the driving frequencies of the startup signal.

As a further example, the controller 230 can provide a duty cycle command to the duty cycle adjuster 220 to instruct the adjuster to provide a control signal to cause the driving oscillator to provide the startup signal with a corresponding proportion of frequencies in the driving range at, above or below the operating frequency of the crystal oscillator 230. For example, if the controller 230 issued a duty cycle command of 50% to the duty cycle adjuster 220, then the duty cycle adjuster would cause the driving oscillator 210 to generate frequencies that were above the operating frequency of the crystal oscillator 240 for about 50% of the time and below the operating frequency of the crystal oscillator the other about 50% of time for a given period of startup signal injection. If the controller 230 issued a duty cycle command of about 25% (e.g., about 25% high frequency applied) high-time to the duty cycle adjuster 220, then the duty cycle adjuster would cause the driving oscillator 210 to generate frequencies that were above the operating frequency of the crystal oscillator 240 for about 25% of the time and below the operating frequency of the crystal oscillator the other about 75% of time for a given period of startup signal injection.

In some examples, during manufacturing and testing of the circuit 200, average output frequency of the driving oscillator 210 can be measured and a fixed code stored for the duty cycle adjuster to indicate what the duty cycle command should be for the duty cycle adjuster 220. In contrast to a testing environment setting, a dynamic tuning example can be provided, where the controller 230 can compare the output frequency of the crystal oscillator 240 with that of the driving oscillator 210. A calibrator 260 in the controller 230 can update separate counters, each of which are driven by a respective output of the driving oscillator 210 and the crystal oscillator 240. The calibrator 260 can include a comparator to compare the values of the respective counters and, depending on the difference in counter values for a given calibration period (e.g., check calibration of oscillators once per hour), the controller 230 can alter the duty cycle command provided to the duty cycle adjuster 220. The controller 230 can adjust the duty cycle in a direction (e.g., increase or decrease) so that a greater proportion of a given injection period is spent in a portion of the frequency range corresponding to the operating frequency of the crystal oscillator. The adjustments could be incremental over time or set to maximize overlap with between the driving frequency range and the operating frequency of the crystal oscillator.

Figure 3:
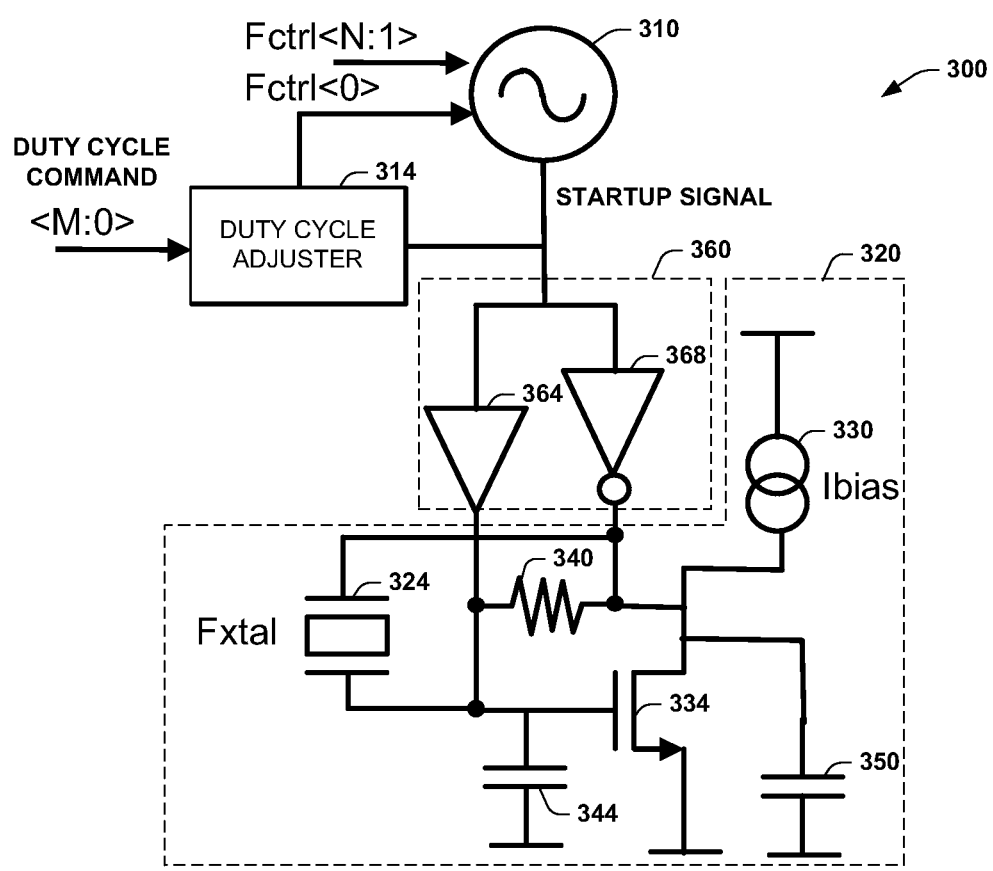
FIG. 3 illustrates an example of a circuit that employs a driving oscillator, duty cycle adjuster, and crystal oscillator circuit to reduce startup time of a crystal oscillator.

FIG. 3 illustrates an example of a circuit 300 that employs a driving oscillator 310, duty cycle adjuster 314, and crystal oscillator circuit 320 to decrease startup time of a crystal oscillator 320. The crystal oscillator circuit 320 includes a current source 330 that supplies current to a transistor 334 which drives the crystal 324. The crystal oscillator circuit 324 can also include a bias resistor 340 between the drain and gate of transistor 334, and load capacitors 344 and 350. An injection circuit 360 includes complementary buffer amplifiers 364 and 368, which are connected to the respective terminals of the crystal 324. The buffer amplifiers 364 and 368 inject the startup signal generated by the driving oscillator 310 into the crystal 324 upon startup. As shown, a duty cycle command (e.g., bits <M:0>) can be provided to the duty cycle adjuster 314 to specify the duty cycle.

Upon receiving the duty cycle command, the duty cycle adjuster 314 can supply the most significant bits specifying a frequency for the driving oscillator 310 as a control work FCTRL <N:1>, for example. The least significant bit FCTRL <0> (or more than one bits in other examples) can be utilized to toggle the frequency (e.g., high and low) of the driving oscillator 310 based on the duty cycle command. The control bits supplied to the driving oscillator 310 can be employed to select an arrangement of capacitors and/or resistors that determine the output frequency of the driving oscillator. As noted previously, if the duty cycle command is 50% for example, then the least significant bit would be toggled low for 50% of the injection time period for the driving oscillator 310 and toggled high for the remaining 50% of the injection time for a given period. The buffer amplifiers (e.g., complementary drivers) 364 and 368 can be turned on at the time power is applied to the crystal 324. The drivers 364 and 368 can be turned off after a predetermined period of time (e.g., 1 to 5 microseconds). By utilizing the injection methods and frequency variations described herein, crystal oscillator 320 startup time can be reduced from about 400 microseconds to less than about 20 microseconds, for example, although other startup time reductions are possible depending on circuit parameters. This reduction in startup time may allow circuitry that utilizes output from the crystal oscillator to remain in a power-off state for longer periods of time, thereby affording increased power efficiency.

Figure 4:
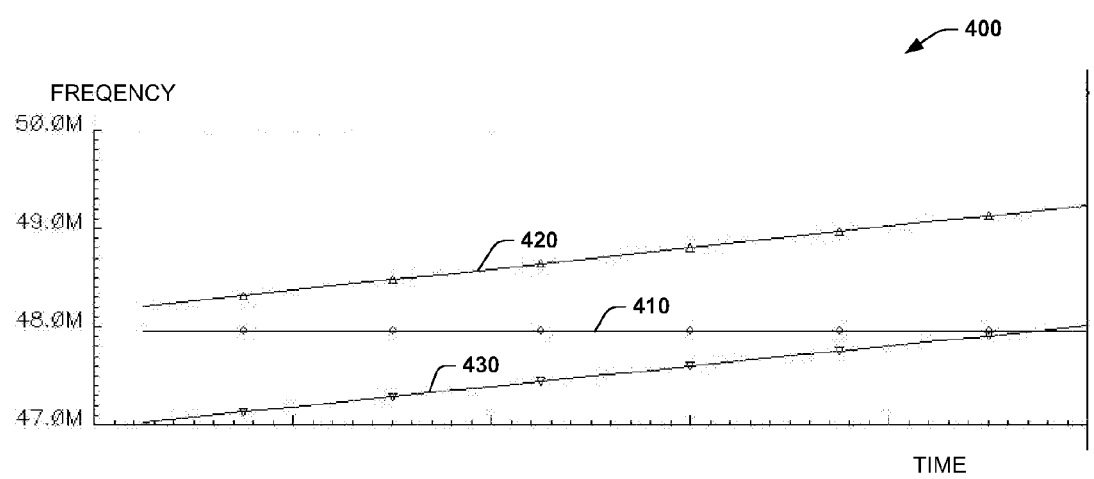
FIG. 4 illustrates an example signal diagram illustrating an example range of frequencies to excite a crystal oscillator.

FIG. 4 illustrates an example signal diagram 400 illustrating and example range of frequencies to excite a crystal oscillator. Line 410 represents the operating frequency (e.g., resonant frequency) of an example crystal oscillator. Line 420 represents example high driving frequencies and line 430 represents example low driving frequencies. In this example, the operating frequency is 48 MHz and is a substantially constant value. The lines 420 and 430 for high frequency and low frequency injection vary about 1 MHz above and below the operating frequency. The lines 420 and 430 can be adjusted higher or lower depending on the duty cycle command described above. The diagram 400 illustrates that the crystal frequency should be within minimum and maximum frequencies generated by the driving oscillator. The duty cycle adjustment described herein changes the percentage of time the driving oscillator is at the high and low frequencies (lines 420 and 430). In this diagram 400, the high and low frequencies themselves are being changed.

Figure 5:
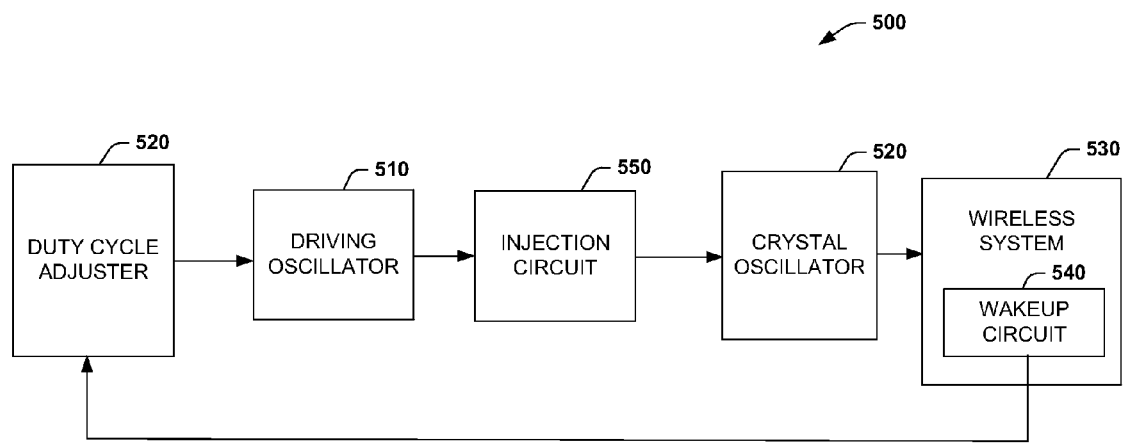
FIG. 5 illustrates an example of a wireless communications system that employs a driving oscillator to reduce startup time of a crystal oscillator.

FIG. 5 illustrates an example of a wireless communications system 500 that employs a driving oscillator 510 to reduce startup time of a crystal oscillator 520. In this example, output from the crystal oscillator 520 drives a subsequent wireless system 530 which can be employed to transmit or receive data over a wireless network (not shown). The wireless system 530 can include a wakeup circuit 540 that periodically activates (e.g., once per second) to initiate the oscillator operations described herein. This can include activating a duty cycle adjuster along with the driving oscillator 510. The wakeup circuit 540 can also activate power to the driving oscillator 510, an injection circuit 550 (e.g., single ended or differential), and the crystal oscillator 520 during the respective activation procedures.

Figure 6:
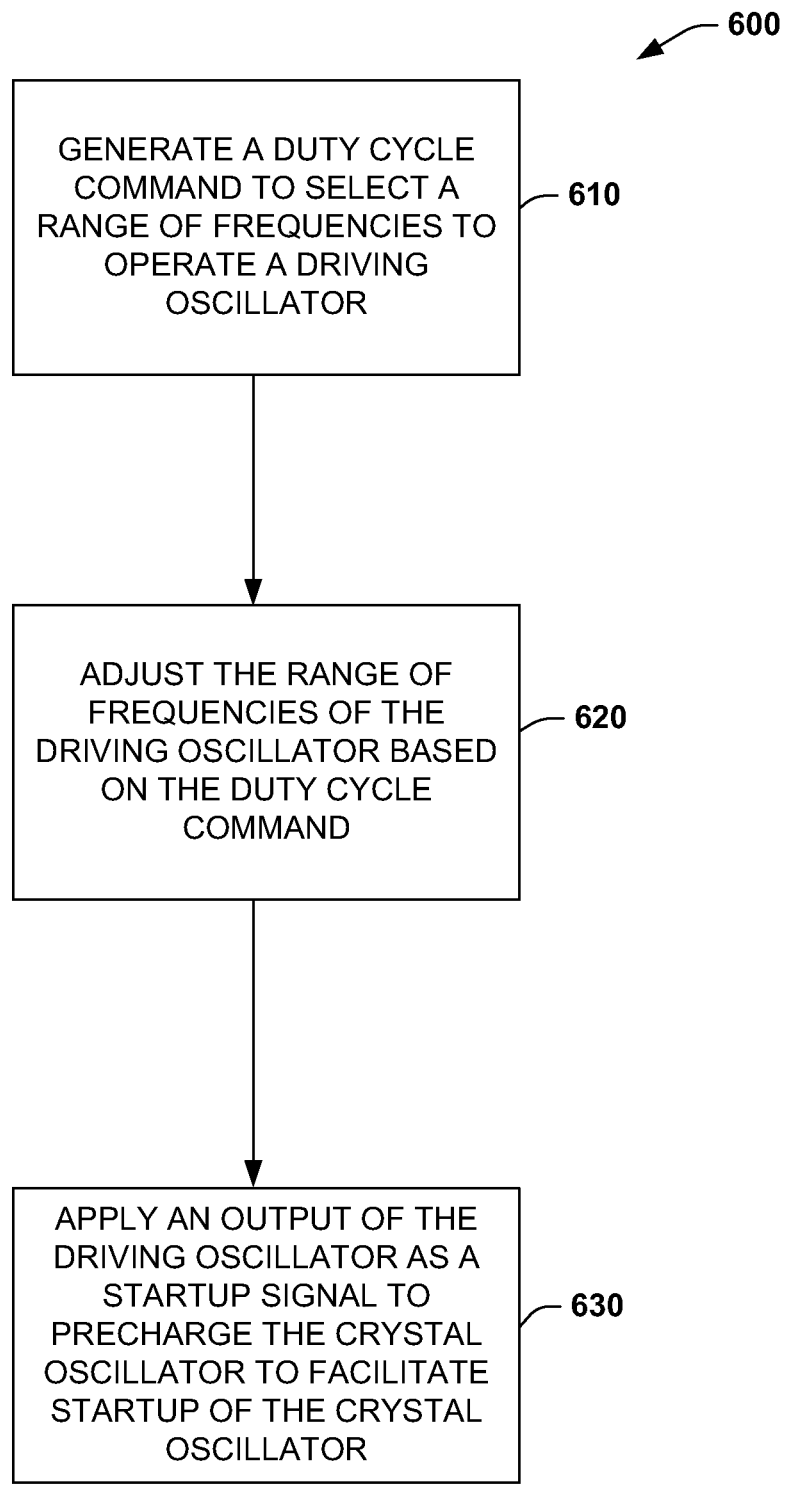
FIG. 6 illustrates an example of a method to decrease startup time of a crystal oscillator.

In view of the foregoing structural and functional features described above, an example method will be better appreciated with reference to FIG. 6. While, for purposes of simplicity of explanation, the method is shown and described as executing serially, it is to be understood and appreciated that the method is not limited by the illustrated order, as parts of the method could occur in different orders and/or concurrently from that shown and described herein.

Such method can be executed by various components and executed by an integrated circuit, computer, or a controller, for example.

FIG. 6 illustrates an example of a method 600 to decrease startup time of a crystal oscillator. At 610, the method 600 includes generating a duty cycle command to select a range of frequencies to operate a driving oscillator (e.g., via controller 230 of FIG. 2). At 620, the method 600 includes adjusting the range of frequencies of the driving oscillator based on the duty cycle command (e.g., via duty cycle adjuster 220 of FIG. 2). The range of frequencies includes the operating frequency of a crystal oscillator. At 630, the method 600 includes applying an output of the driving oscillator as a startup signal to activate the crystal oscillator to facilitate startup of the crystal oscillator (e.g., via driving oscillator 210 of FIG. 2). Although not shown, the method 600 can also include adjusting the duty cycle command to alter the driving frequency of the driving oscillator above and below the driving frequency of the crystal oscillator, such as disclosed herein. This can also include adjusting the duty cycle command based on a comparison of the operating frequency of the crystal oscillator and driving frequency of the driving oscillator (e.g., by calibrator 260 of controller 230 of FIG. 2). After the driving oscillator has been applied at 630, a timer or other control can deactivate the driving oscillator after a predetermined period of time, for example.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A circuit comprising:
    a crystal oscillator to generate an output frequency for an associated circuit; and
    a driving oscillator to generate a startup signal having a driving frequency that is provided to activate the crystal oscillator, in which the driving frequency of the startup signal is varied over a range of frequencies that encompasses an operating frequency of the crystal oscillator and is above and below the operating frequency of the crystal oscillator to facilitate startup of the crystal oscillator, the driving oscillator including at least one of a capacitor array and a resistor array that are selectively switched to change a capacitance or a resistance in the respective array to alter the driving frequency of the driving oscillator.

2. The circuit of claim 1, including a duty cycle adjuster that receives a duty cycle command to alter the driving frequency of the driving oscillator over the range of frequencies.

3. The circuit of claim 2, in which the duty cycle command specifies an amount of time that the driving frequency is above and below the operating frequency of the crystal oscillator.

4. The circuit of claim 1, including a wakeup circuit to periodically activate the driving oscillator and the crystal oscillator for a wireless communications system.

5. The circuit of claim 2, including a controller to provide the duty cycle command to the duty cycle adjuster.

6. The circuit of claim 5, in which the controller further comprises a calibrator to adjust the duty cycle command based on a comparison of the operating frequency of the crystal oscillator and driving frequency of the driving oscillator.

7. The circuit of claim 6, in which the calibrator comprises: a first counter being triggered in response to the operating frequency of the crystal oscillator to provide a first counter output; a second counter triggered in response to the driving frequency of the driving oscillator to provide a second counter output; and a comparator to compare the first and second outputs to provide the comparison.

8. The circuit of claim 1, including an injection circuit that includes at least one buffer to provide the startup signal from the driving oscillator to the crystal oscillator.

9. A system comprising:
    a crystal oscillator having an input and an output;
    a driving oscillator to provide a startup signal to the input of the crystal oscillator, the driving oscillator including a control input; and
    a duty cycle adjuster coupled to the control input of the driving oscillator to vary the startup signal over a range of frequencies that encompasses the operating frequency of the crystal oscillator and that is above and below the operating frequency of the crystal oscillator, the driving oscillator including at least one of a capacitor array and a resistor array that are selectively switched to change a capacitance or a resistance in the respective array to alter the driving frequency of the driving oscillator.

10. The system of claim 9, in which the duty cycle adjuster receives a duty cycle command to alter the driving frequency of the driving oscillator over the range of frequencies.

11. The system of claim 10, in which the duty cycle command specifies an amount of time that the driving frequency is above and below the operating frequency of the crystal oscillator.

12. The system of claim 10, including a wakeup circuit to periodically activate the duty cycle adjuster, the driving oscillator and the crystal oscillator for a wireless communications system.

13. The circuit of claim 12, including a controller to specify the duty cycle command to alter the driving frequency of the driving oscillator over the range of frequencies.

14. The circuit of claim 13, in which the controller further comprises a calibrator to adjust the duty cycle command based on a comparison of the operating frequency of the crystal oscillator and driving frequency of the driving oscillator.

15. The circuit of claim 14, in which the calibrator further comprises: a first counter being triggered in response to the operating frequency of the crystal oscillator to provide a first counter output; a second counter triggered in response to the driving frequency of the driving oscillator to provide a second counter output; and a comparator to compare the first and second outputs to provide the comparison.

16. A method comprising:
    generating, by a controller, a duty cycle command to select a range of frequencies to operate a driving oscillator;

adjusting the range of frequencies of the driving oscillator based on the duty cycle command, in which the range of frequencies is above and below an operating frequency of a crystal oscillator by selectively switching at least one of a capacitor array and a resistor array to change a capacitance or a resistance in the respective array to alter the driving frequency of the driving oscillator; and applying an output of the driving oscillator as a startup signal to activate the crystal oscillator to facilitate startup of the crystal oscillator.

17. The method of claim 16, including adjusting the duty cycle command to alter the driving frequency of the driving oscillator above and below the driving frequency of the crystal oscillator.

18. The method of claim 17, including adjusting the duty cycle command based on a comparison of the operating frequency of the crystal oscillator and driving frequency of the driving oscillator.

\* \* \* \* \*